United States Patent
Tsuchiya et al.

[11] Patent Number: 6,146,911
[45] Date of Patent: Nov. 14, 2000

[54] SEMICONDUCTOR WAFER AND METHOD OF MANUFACTURING THE SAME

[75] Inventors: Norihiko Tsuchiya, Setagaya-Ku; Hiroshi Matsushita, Funabashi, both of Japan

[73] Assignee: Kabushiki Kaisha Toshiba, Kawasaki-shi, Japan

[21] Appl. No.: 09/263,216

[22] Filed: Mar. 5, 1999

[30] Foreign Application Priority Data

Mar. 19, 1998 [JP] Japan ................................. 10-070709

[51] Int. Cl.$^7$ ....................................... H01L 21/66
[52] U.S. Cl. ............................................ 438/14; 438/800
[58] Field of Search ............................... 438/14, 15–18, 438/5, 6–13, 800; 148/33, 33.1–33.6; 356/237

[56] References Cited

U.S. PATENT DOCUMENTS 5,502,331  3/1996  Inoue et al. .
5,995,217  8/1998  Watanabe .................. 356/237

FOREIGN PATENT DOCUMENTS 6-310517  11/1994  Japan .

*Primary Examiner*—Tuan H. Nguyen
*Assistant Examiner*—Craig Thompson
*Attorney, Agent, or Firm*—Oblon, Spivak, McClelland, Maier & Neustadt, P.C.

[57] ABSTRACT

The average density and scattered light intensity or the average density and average size of void defects contained in a surface region in a predetermined depth of a semiconductor wafer sample are measured. An ingot whose a semiconductor wafer sample satisfies $D \times Is \leq$ a predetermined value between the measured average density D and scattered light intensity Is or satisfies $D \times L^3 \leq$ fixed value between the measured average density D and average size L is extracted and wafers cut from the ingot are annealed. The semiconductor wafers having few residual defects in a surface region wherein devices are to be formed can be obtained.

10 Claims, 7 Drawing Sheets

| SEMICONDUCTOR WAFER | A | B | C | D |
|---|---|---|---|---|
| LSTD MAPPING IMAGE | | | | |
| LSTD DENSITY ($cm^{-2}$) | 100 | 126 | 0.1 | 0.1 |
| LSTD SCATTERING INTENSITY (a.u.) | 263 | 215 | 230 | 245 |

FIG. 4

| SEMICONDUCTOR WAFER | A' | B' |
|---|---|---|
| LSTD MAPPING IMAGE | | |
| LSTD DENSITY ($cm^{-2}$) | 29 | 6 |
| LSTD SCATTERING INTENSITY (a.u.) | 166 | 142 |

FIG. 5

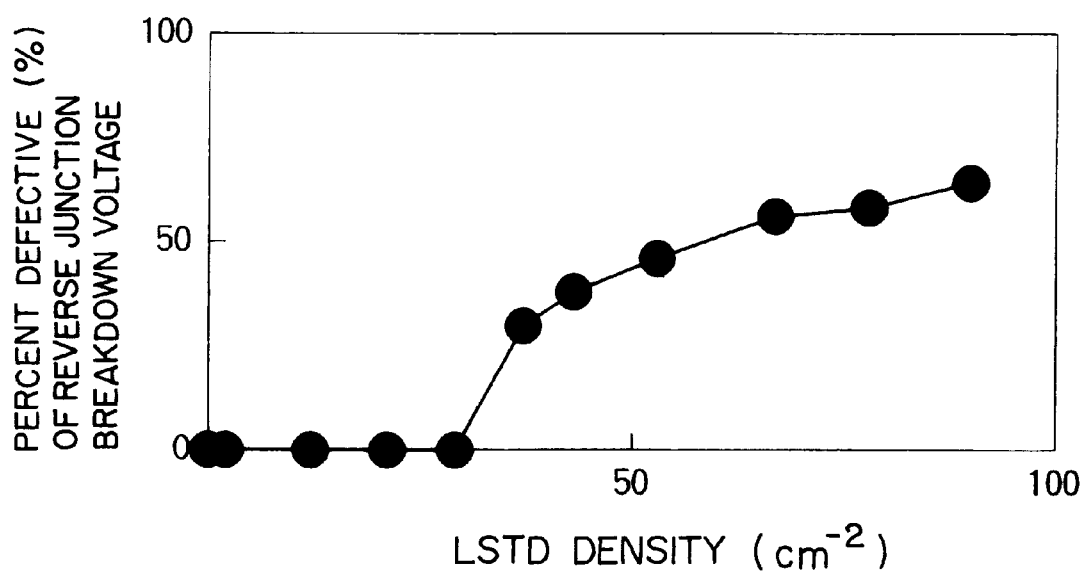
F I G. 6

SEMICONDUCTOR WAFER AND METHOD OF MANUFACTURING THE SAME

BACKGROUND OF THE INVENTION

The present invention relates to a semiconductor wafer manufacturing method and a semiconductor wafer manufactured using this method.

Semiconductor wafers, particularly silicon wafers for forming semiconductor devices are manufactured using the CZ (Czochralski) method or the magnetic field applied CZ method (MCZ method). Crystals grown using these methods contain octahedral void defects (Grown-in defects) from 0.1 to 0.3 $\mu$m in void size at a volume density of about $10^6$ cm$^{-3}$. Such defects seldom disappear using normal annealing. Accordingly, when LSIs or ULSIs in which devices such as MOSFETs with high density integration are formed on a semiconductor wafer, void defects degrade the transistor gate oxide film. This is reported in the following reference.

Reference 1: Itsumi et al., Journal of Applied Physics, Vol. 78, 1995, pp. 15

A void defect is called a COP (Crystal Originated Particle) or an LSTD (Light Scattering Tomography Defect) according to the wafer evaluation method. As shown in FIG. 1, COPs 3 are void defects which cross the surface of a semiconductor wafer 1. As described in the following reference, these COPs completely disappear when annealing is performed in a high-temperature hydrogen ($H_2$) atmosphere. As a result, the characteristics of the gate oxide film are greatly improved.

Reference 2: Miyashita et al., Proceeding of for the 24th Ultraclean Technology Symposium, 1995, page 334

Even when annealing is performed, however, LSTDs 2 do not disappear and remain in a surface region about 2 $\mu$m deep from the surface on which semiconductor devices are to be formed. These LSTDs lower the insulation resistance or cause defective insulation in element isolation regions, degrading the reverse breakdown voltage characteristic in junctions.

Also, in the generations of ULSI devices having design rules of 0.25 $\mu$m or more, e.g., DRAMs (Dynamic Random Access Memories) of 256 Mbits or more, the size of a LSTD can be larger than the design rule for a device. When micropatterning thus advances, the breakdown voltage of the gate oxide film lowers, and various operational of errors occur in the devices which rely on the existence of the LSTDs. The (111) plane of the inner wall of an LSTD is covered with 2- to 3-$\mu$m of silicon oxide film. Because of this LSTD has interface state density similar to that of BMD (Bulk Micro Defect) or oxygen precipitates, and function as the center for the generation and recombining of carriers. This may cause a fatal defective leak in DRAMs.

The conventional void defect evaluation is performed as described in Japanese Patent Publication No. 2,520,316. Referring to FIG. 1, silicon on the surface of the semiconductor wafer 1 is dissolved slightly with an ammonia-based cleaning solution ($NH_4OH/H_2O_2/H_2O$) to expose the COPs 3 on the surface. A particle counter is used to irradiate the surface with incident light IL1 and detect the COPs 3 by receiving scattered light SL1. This method can detect the COPs 3 on the surface and other defects to a depth of 0.3 $\mu$m from the surface. However, the method cannot be used detect the LSTDs 2 at deeper levels 2 $\mu$m from the surface.

Although Japanese Patent Publication No. 7-29878 has disclosed a technique for inspecting COPs on the wafer surface, even when a wafer found to be good by this inspection method is used to form devices, internal LSTDs may cause operation errors. However, no conventional methods can reduce LSTDs about 2 $\mu$m from the surface of a semiconductor wafer where devices are formed, and thus operational errors still occur.

As described above, no conventional methods can reduce LSTDs in the surface region where devices are formed, although the methods can detect and eliminate COPs on the wafer surface.

SUMMARY OF THE INVENTION

It is, therefore, an object of the present invention to provide a method of manufacturing a semiconductor wafer, capable of reducing LSTDs which cause operation errors in devices, and a semiconductor wafer manufactured by the method.

The present invention provides a method of manufacturing a semiconductor wafer, comprising the steps of measuring an average density in a semiconductor wafer sample and the average size or light scattering intensity of void defects contained at a predetermined depth from the surface region of the semiconductor wafer sample, extracting an ingot whose the semiconductor wafer sample satisfies the equation $D \times L^3 \leq$ a predetermined value between the measured average density D and average size L, or satisfies the equation $D \times Is \leq$ a predetermined value between an average value of the light scattering intensity in the wafer is and the average density D, and annealing semiconductor wafers cut from the extracted ingot.

In this method of manufacturing a semiconductor wafer of the present invention, an ingot whose a semiconductor wafer sample in which a fixed relationship holds true between the average density and scattering light intensity or the average density and average size of LSTDs contained in a surface region is extracted and semiconductor wafers are annealed. Accordingly, a wafer having few residual defects can be obtained.

In the step of measuring the average density and average size or light scattering intensity of void defects, the surface of the semiconductor wafer sample can be irradiated with a visible laser beam having energy equal to or higher than band gap energy of silicon to measure the average density and average size or light scattering intensity of void defects contained in a surface region up to about 2 $\mu$m deep from the surface of the semiconductor wafer sample. In the step of extracting an ingot, an ingot whose a semiconductor wafer sample satisfies $D \times L^3 \leq 0.53$ between the average density D (cm$^{-2}$) and the average size L ($\mu$m) or satisfies a semiconductor wafer in which $D \times Is \leq 0.53$ K (K is a constant determined by a measurement apparatus) between the average value in the plane of the wafer for the light scattering intensity Is and the average density D can be extracted. In the step of annealing semiconductor wafers, semiconductor wafers can be held in a reducing gas or inert gas atmosphere at about 1,100° C. or more for about 6 hrs or less.

A semiconductor wafer of the present invention is manufactured by the above manufacturing method and has an average density of void defects in the surface region of about 30 defects/cm$^{-2}$ or less.

BRIEF DESCRIPTION OF THE DRAWINGS

FIG. 4 is a view showing the distributions, densities, and sizes of LSTDs in surface regions of semiconductor wafers before annealing;

FIG. 5 is a view showing the distributions, densities, and sizes of LSTDs remaining in surface regions of semiconductor wafers after annealing;

FIG. 6 is a graph showing the relationship between the LSTD density and the percent defective of junction breakdown voltage;

DESCRIPTION OF THE PREFERRED EMBODIMENTS

One embodiment of the present invention will be described below with reference to the accompanying drawings.

As will be described later with reference to FIG. 2, a method of manufacturing a semiconductor wafer of this embodiment is characterized in that the average density D and the average size L of LSTDs contained in a surface region within a predetermined depth of each semiconductor wafer sample are measured, and a ingot whose a wafer sample having a predetermined relationship between the two parameters is extracted and wafers cut from the ingot are annealed. First, the process for achieving this method will be described in detail below.

Visible light scattering topography was performed on the entire surface of as-grown semiconductor wafer samples A and B in which crystal growth was performed by the CZ method, and semiconductor wafer samples C and D, in which epitaxial growth was performed, thereby measuring the average density and average size of LSTDs. The LSTD measurements using visible light scattering topography is described in the following reference.

Reference 3: Moriya et al., Abstract for '97 Spring Meeting of Japan Society of Applied Physics, Lecture No. 30a-L-7

Figure 3A:
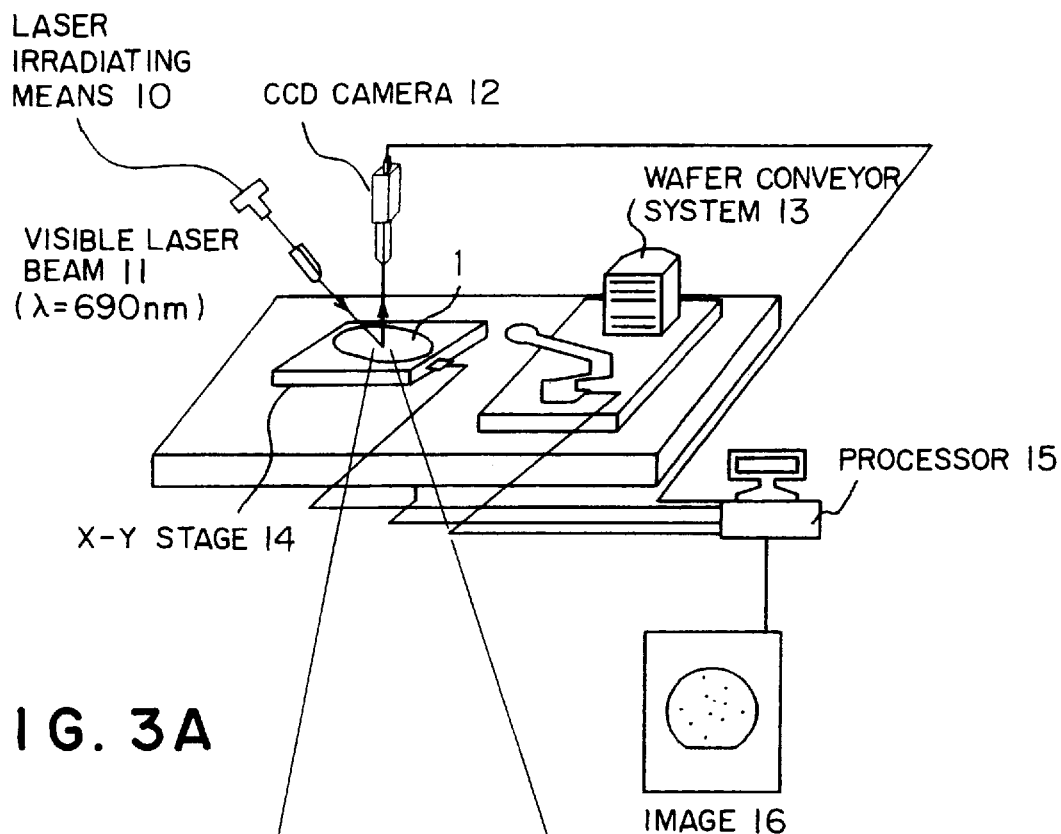
FIGS. 3A to 3C are views showing an LSTD measuring apparatus used in the manufacturing method and showing detectable LSTDs.

The measurements were performed by using a measuring apparatus (MO-601, trade name LSTD Scanner, available from Mitsui Mining & Smelting Co., Ltd.) as shown in FIG. 3A. In this apparatus, a semiconductor wafer 1 is conveyed by a wafer conveyor system 13 and placed on an X-Y stage 14. A laser irradiating means 10 obliquely irradiates the surface of the semiconductor wafer 1 with a visible laser beam 11. This visible laser beam 11 has a wavelength λ of 690 nm and an energy of 1.16 eV or more. Laser light having a band gap energy of 1.16 eV of silicon or more is absorbed into the surface of the semiconductor wafer 1. Therefore, the transmittance is low, and the depth of penetration is determined by the wavelength.

By irradiating the surface with this visible laser beam 11, a CCD camera 12 receives image information, and a processor 15 obtains an image 16. The effective detection depth is about 2 μm from the surface of the semiconductor wafer 1, and the minimum detectable size of LSTD is about 40 nm.

Figure 3B:
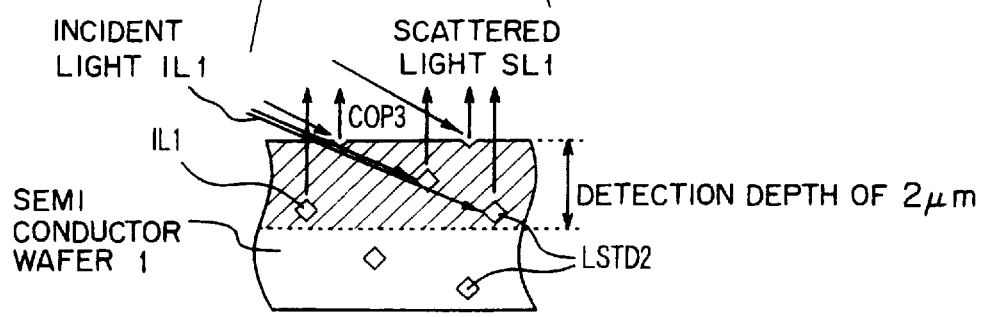
Figure 3C:
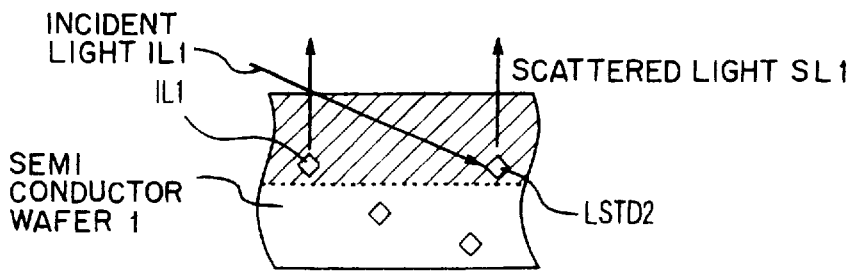

Consequently, it is possible to detect not only COPs 3 on the surface of the as-grown semiconductor wafer 1 shown in FIG. 3B but also LSTDs 2 in the semiconductor wafer. Also, as shown in FIG. 3C, LSTDs 2 remaining in a 2-μm deep surface region in the annealed semiconductor wafer 1 can be detected.

FIG. 4 shows the measurement results, i.e., a mapping image expressing an LSTD distribution, LSTD average density, and LSTD scattering intensity (arbitrary unit to be abbreviated as a.u. hereinafter) in each of the semiconductor wafer samples A to D. The density can also be represented by volume density ($cm^{-3}$). In this embodiment, however, the density is represented by surface density ($cm^{-2}$) in a depth of 2 μm from the wafer surface. The scattering intensity corresponds to the size of LSTD.

In the wafer samples A and B, LSTDs distribute almost uniform over the entire surface. The LSTD density of the wafer sample B is slightly higher than that of the wafer A. The scattering intensity, i.e., the LSTD size is larger in the wafer sample A. In the wafer samples C and D, almost no LSTD exist, and the density is extremely low.

Of the wafer samples A to D, high-temperature annealing was performed for the wafer samples A and B having high LSTD densities in a hydrogen atmosphere at 1,200° C. for about 1 hr, thereby forming wafer samples A' and B', respectively. FIG. 5 shows the measurement results of an LSTD mapping image, LSTD density, and LSTD scattering intensity in each of the wafer samples A' and B'. Before annealing, the LSTD density of the wafer sample B was higher than that of the wafer sample A. After annealing, however, the LSTD density of the wafer sample A' was higher than that of the wafer sample B'. That is, the relationship between the two densities before annealing is reversed after that.

This fact means that no good wafers can be obtained even if LSTD density measurement is performed for wafers before annealing to select those having low densities and the selected wafers are annealed.

Additionally, the LSTD scattering intensity, i.e., the LSTD size in the wafer sample A was higher than that in the wafer sample B both before and after annealing. This indicates that the LSTD density after annealing is influenced not only by the LSTD density before annealing but also by the LSTD size. Therefore, it is necessary to choose and anneal wafers by taking account of this fact.

After the above measurements, LSTD measurements were performed following the same procedure as for the wafer samples A to D on a plurality of silicon wafers formed under different crystal growth conditions. Consequently, it was found that the LSTD density and size largely depended upon various seed crystal conditions, e.g., the pulling rate and cooling rate during growth, hysteresis such as thermal gradient, and wafer cutting position, and took different values in accordance with these parameters.

Next, the relationship between an LSTD and an operation error, particularly a junction leak was checked. The influence of an LSTD on a junction leak has been unknown. Therefore, to check the degree of reduction of the LSTD density in a surface region of a wafer with which the influence on a device can be prevented, diodes were formed to obtain current-voltage curves, thereby measuring the percent defectives.

More specifically, semiconductor wafers having ten different LSTD residual densities from 2 to 90 $cm^{-2}$ in a surface region after annealing were prepared. Boron was ion-implanted at a dose of $1 \times 10^{13}$ $cm^{-2}$ and an acceleration voltage of 100 keV into each wafer to form a well. A field oxide film 650 nm thick was formed to perform element isolation. After that, arsenic was ion-implanted at a dose of $2\times10^{15}$ cm$^{-2}$ and an acceleration voltage of 30 keV, and annealing was performed at 800° C., thereby forming an n*-p junction.

FIG. 6 shows the result of measurement of the reverse junction breakdown voltage in the junction of each semiconductor wafer. In FIG. 6, the abscissa indicates the LSTD density, and the ordinate indicates the percent defective of wafers in which a leakage current of $1\times10^{-9}$ A or more flowed when a voltage of 4.5 V was applied in a reverse direction to the junction. This graph shows that the LSTD density of a semiconductor wafer in which almost no defective junction occurred was 30 cm$^{-2}$ or less. When the LSTD density exceeded 30 cm$^{-2}$, the percent defective of junction breakdown voltage abruptly rose. It is considered that this phenomenon occurred because when LSTDs are trapped in a depletion layer they function as the center of generation of carriers and increase the leakage current.

Figure 7:
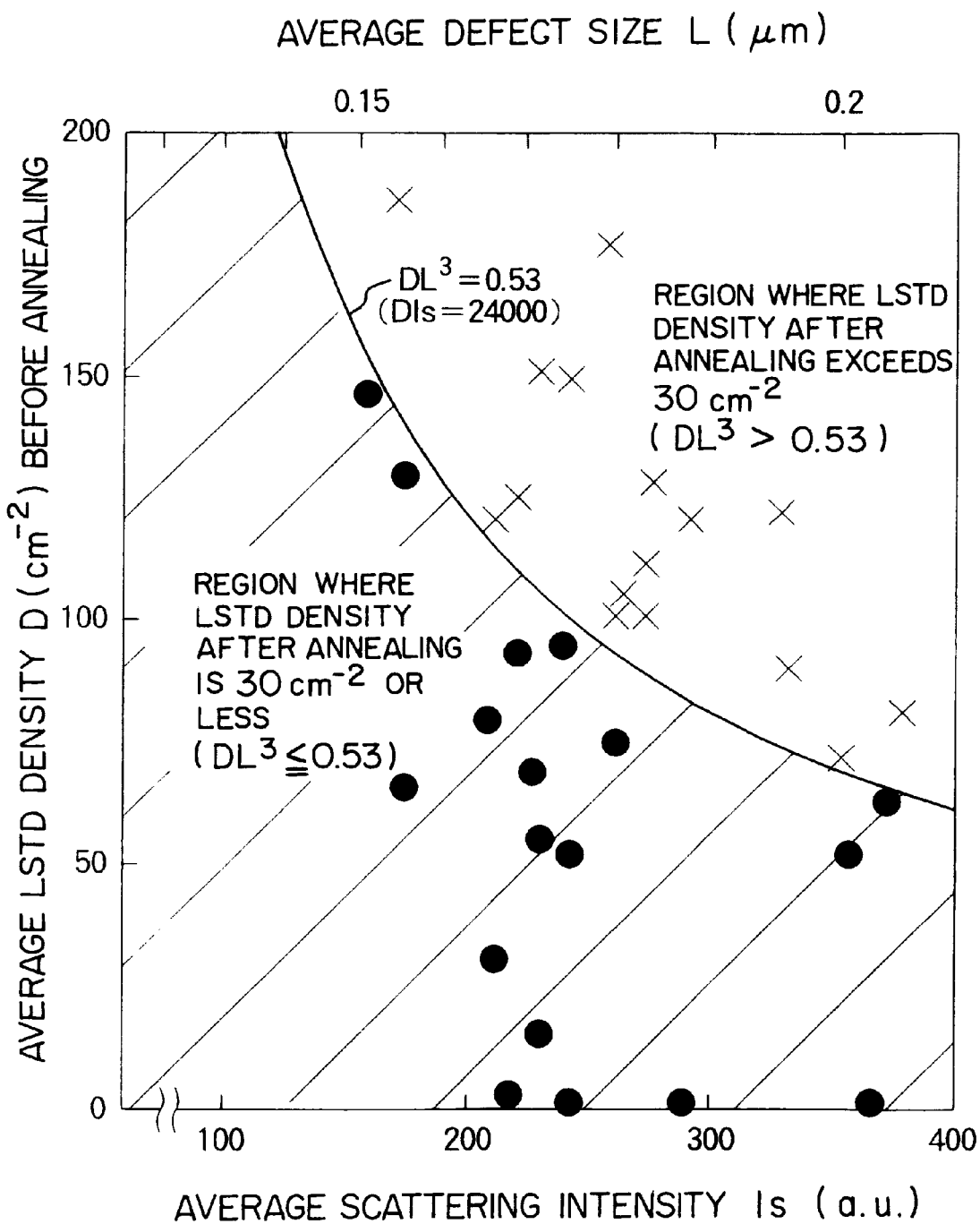
FIG. 7 is a graph showing the relationships between the density and size of LSTDs and the relationships between the density and average scattering intensity of LSTD in a surface region of a semiconductor wafer before and after annealing.

A plurality of different kinds of wafers formed under different growth conditions were annealed, and the LSTD average density and average size before and after annealing were measured. FIG. 7 is a graph plotting the measurement results. In this graph, the abscissa indicates an average scattering intensity Is (a.u.) of LSTDs directly obtained during the measurement and the corresponding LSTD average size ($\mu$m). The ordinate indicates the average density before annealing. In the graph, "•" indicates a density of 30 cm$^{-2}$ or less after annealing, and "x" indicates a density higher than 30 cm$^{-2}$ after annealing.

FIG. 7 shows that a relationship approximated to the following equation holds true between a wafer having an average LSTD density of 30 cm$^{-2}$ or less after annealing and a wafer having an average LSTD density exceeding 30 cm$^{-2}$ after annealing.

$$D \cdot Is = 24,000 \quad (1)$$

where D is the average density (cm$^{-2}$) of LSTDs and Is is the scattered light intensity (a.u.) of the LSTDs.

It is experimentally found that a relationship approximated to the following equation holds true between the scattered light intensity and the average LSTD size when the absorption of light and the spread of the frequency distribution of size are taken into consideration.

$$Is = K \cdot L^3 \quad (2)$$

where K is a proportional constant determined by a measurement apparatus.

Figure 8:
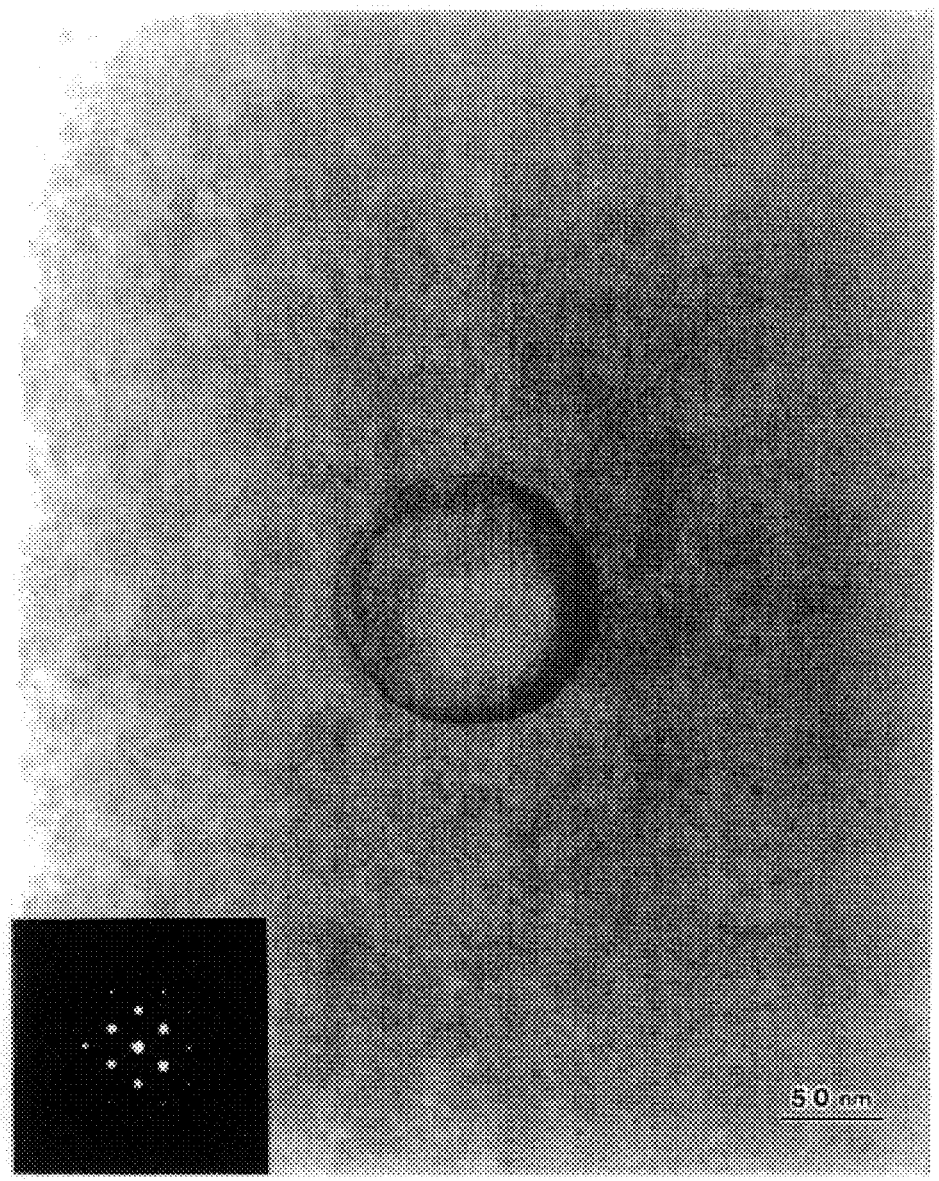
FIG. 8 is a cross-sectional TEM micrograph showing the size of LSTD remaining in a surface region of a semiconductor wafer after annealing.
Figure 8:
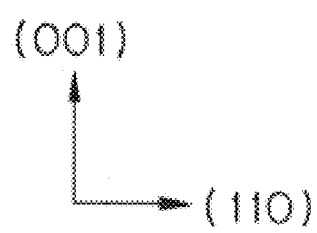

FIG. 8 shows an image when the size of a LSTD was measured by using transmission electron microscopy (TEM) and indicates that the size was 0.13 $\mu$m. Because the depth of this LSTD was 2.0 $\mu$m deep by TEM observation, the light scattering intensity of this LSTD obtained by the light scattering topography described earlier was corrected to the scattering intensity of surface (0 $\mu$m deep), was Is=100 (a.u.) This value and equations (1) and (2) yield $$D \cdot L^3 = 0.53 \quad (3)$$

where the units are cm$^{-2}$ for D and $\mu$m for L for the sake of descriptive convenience. The term $D \cdot L^3$ is an amount proportional to the total volume of LSTDs contained in a unit volume in crystal. This demonstrates that the LSTD residual density can be decreased by selecting wafers having small values of this term and annealing them at a high temperature.

Figure 1:
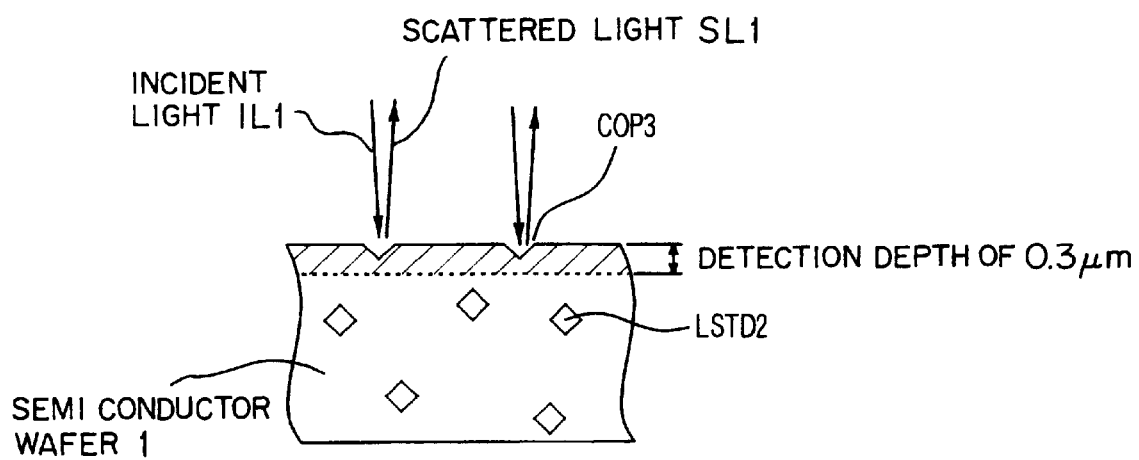
FIG. 1 is a sectional view for explaining a conventional method for measuring COPs on the surface of a semiconductor wafer sample.
Figure 2:
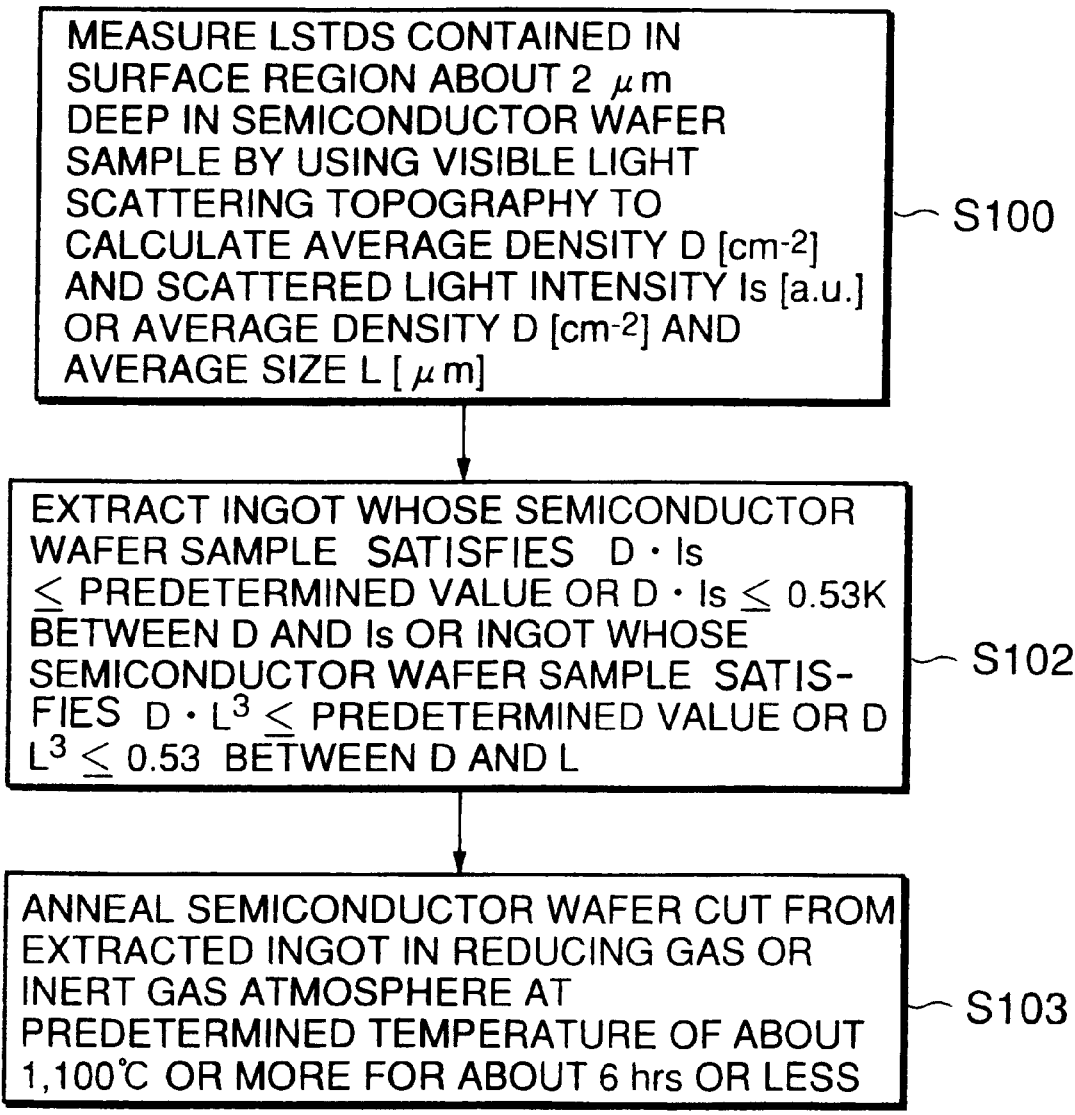
FIG. 2 is a flow chart showing the steps of a method for manufacturing a semiconductor wafer according to one embodiment of the present invention.

On the basis of the aforementioned measurements and considerations, the method of manufacturing a semiconductor wafer according to this embodiment comprises steps shown in FIG. 2.

In step S101, LSTDs contained in a surface region (about 2 $\mu$m deep) of a semiconductor wafer sample are measured by using visible light scattering topography to calculate the average density D (cm$^{-2}$) and the scattering light intensity Is (a.u.), or the average density D (cm$^{-2}$) and the average size L ($\mu$m).

In step S102, an ingot whose a wafer sample satisfies $D \cdot Is \leq$ predetermined value or $D \cdot Is \leq 0.53$ K between the average density D and the scattering light intensity Is or an ingot whose a wafer sample satisfies $D \cdot L^3 \leq$ predetermined value or $D \cdot L^3 \leq 0.53$ between the average density D and the average size L is extracted.

In step S103, wafers cut from the extracted ingot are annealed in a reducing gas or inert gas atmosphere at a fixed temperature of about 1,100° C. or more for about 6 hrs or less.

As described above, under the manufacturing method of this embodiment, an ingot whose a wafer sample where the product of the third power of the average size of LSTDs and the average density of the LSTDs in the surface region is a predetermined value (e.g., 0.53) or less, is selected and wafers cut from the ingot are annealed at a high temperature. In semiconductor wafers manufactured by this embodiment as above, the residual LSTD density decreases to a predetermined value (e.g., 30 defects/cm$^2$) or less. As a consequence, when devices are formed by using semiconductor wafers manufactured by the method of this embodiment, it is possible to improve the junction leak characteristic and thereby increase the yield and reliability.

According to the above embodiment, not all wafers are measured. However, if a wafer sample cut from an ingot is measured and satisfies the above equation, all wafers cut from the ingot can be considered as satisfying the equation. Therefore, there is no need to spend a great deal of time measuring the wafers.

The above embodiment is merely an example and does not restrict the present invention. For example, in the above embodiment LSTDs in a depth of about 2 $\mu$m from the surface of a semiconductor wafer sample are measured. However, this depth can be changed in accordance with the depth of a device formation layer. Also, LSTDs at different depths can be measured by changing the wavelength, incident angle, and the power of the laser irradiation beam and by changing the camera sensitivity. Furthermore, in the above embodiment the product of the third power of the average size of LSTDs and the average density of the LSTDs is 0.53 or less. However, this value is merely an example and can be changed in accordance with various conditions such as characteristics required of a device to be formed.

What is claimed is:

1. A method of manufacturing a semiconductor wafer, comprising the steps of:

measuring an average density in plane of a semiconductor wafer sample and average size of void defects contained in a surface region in a predetermined depth of the semiconductor wafer sample;

extracting an ingot whose semiconductor wafer sample satisfies an equation $D \times L^3 \leq$ a predetermined value between the measured average density D and average size L; and annealing semiconductor wafers cut from the extracted ingot.

2. A method according to claim 1, wherein in the step of measuring the average density and average size of void defects, the surface of the semiconductor wafer sample is irradiated with a visible laser beam having energy not less than band gap energy of silicon to measure the average density and average size of void defects contained in a surface region up to about 2 μm deep from the surface of the semiconductor wafer sample.

3. A method according to claim 1, wherein in the step of extracting an ingot, an ingot whose the semiconductor wafer sample satisfies an equation $D \times L^3 \leq 0.53$ between the average density D ($cm^{-2}$) and the average size L (μm) is extracted.

4. A method according to claim 1, wherein in the step of annealing a semiconductor wafers, semiconductor wafers are held in a reducing gas or inert gas atmosphere at about not less than 1,100° C. for about not more than 6 hrs.

5. A method of manufacturing a semiconductor wafer, comprising the steps of:

measuring an average density in plane of a semiconductor wafer sample and light scattering intensity of void defects contained in a surface region in a predetermined depth of the semiconductor wafer sample;

extracting an ingot whose semiconductors wafer sample satisfies an equation $D \times Is \leq$ a predetermined value between the measured average density D and an average value Is in plane of the semiconductor wafer sample of the measured light scattering intensity; and annealing semiconductor wafers cut from the extracted ingot.

6. A method according to claim 5, wherein in the step of measuring the average density and light scattering intensity of void defects, the surface of the semiconductor wafer sample is irradiated with a visible laser beam having energy not less than band gap energy of silicon to measure the average density and light scattering intensity of void defects contained in a surface region up to about 2 μm deep from the surface of the semiconductor wafer sample.

7. A method according to claim 5, wherein in the step of extracting an ingot, an ingot whose the semiconductor wafer sample satisfies an equation $D \times Is \leq 0.53K$ (K is a constant determined by a measurement apparatus) between the average value Is in plane of wafer of the light scattering intensity and the average density D is extracted.

8. A method according to claim 5, wherein in the step of annealing semiconductor wafers, semiconductor wafers are held in a reducing gas or inert gas atmosphere at about not less than 1,100° C. for about not more than 6 hrs.

9. A semiconductor wafer manufactured by a semiconductor wafer manufacturing method comprising the steps of:

measuring an average density in plane of a semiconductor wafer sample and average size of void defects contained in a surface region in a predetermined depth of the semiconductor wafer sample;

extracting an ingot whose semiconductor wafer sample satisfies an equation $D \times L^3 \leq$ a predetermined value between the measured average density D and average size L; and annealing semiconductor wafers cut from the extracted ingot, wherein the average density of void defects contained in the surface region is not more than about 30 defects/$cm^{-2}$.

10. A semiconductor wafer manufactured by a semiconductor wafer manufacturing method comprising the steps of:

measuring an average density in plane of a semiconductor wafer sample and light scattering intensity of void defects contained in a surface region in a predetermined depth of the semiconductor wafer sample;

extracting an ingot whose semiconductor wafer sample satisifes an equation $D \times Is \leq$ a predetermined value between the measured average density D and an average value Is in plane of wafer of the measured light scattering intensity; and annealing semiconductor wafers cut from the extracted ingot, wherein the average density of void defects contained in the surface region is not more than about 30 defects/$cm^{-2}$.

* * * * *